(12) United States Patent
Kim et al.

(10) Patent No.: US 6,900,124 B1
(45) Date of Patent: May 31, 2005

(54) PATTERNING FOR ELLIPTICAL $V_{SS}$ CONTACT ON FLASH MEMORY

(75) Inventors: Hung-eil Kim, San Jose, CA (US); Anna Minvielle, San Jose, CA (US); Christopher F. Lyons, Fremont, CA (US); Marina V. Plat, San Jose, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 98 days.

(21) Appl. No.: 10/654,739

(22) Filed: Sep. 3, 2003

(51) Int. Cl.[7] .......................................... H01L 21/4763
(52) U.S. Cl. ...................... 438/637; 438/672; 438/638; 257/390; 257/316; 257/371
(58) Field of Search ............................... 438/637–638; 257/316–317, 390

(56) References Cited

U.S. PATENT DOCUMENTS

| | | |
|---|---|---|
| 5,242,770 A | 9/1993 | Chen et al. |
| 5,636,002 A | 6/1997 | Garofalo |
| 5,674,773 A | 10/1997 | Koh et al. |
| 5,973,374 A * | 10/1999 | Longcor ....................... 257/390 |
| 6,515,329 B2 | 2/2003 | Lee et al. |
| 6,521,522 B2 | 2/2003 | Cho |

OTHER PUBLICATIONS

Levenson et al., "The Vortex Mask: Making 80nm contacts with a twist!"

* cited by examiner

*Primary Examiner*—Dung A. Le
(74) *Attorney, Agent, or Firm*—Renner, Otto, Boisselle & Sklar, LLP (57) ABSTRACT

A method of forming a contact in a flash memory device is disclosed. The method increases the depth of focus margin and the overlay margin between the contact and the stacked gate layers. A plurality of stacked gate layers are formed on a semiconductor substrate, wherein each stacked gate layer extends in a predefined direction and is substantially parallel to other stacked gate layers. An interlayer insulating layer is deposited over the plurality of stacked gate layers, and a contact hole is patterned between a first stacked gate layer of the plurality of stacked gate layers and a second stacked gate layer of the plurality of stacked gate layers. The contact hole is formed in an elongated shape, wherein a major axis of the contact hole is substantially parallel to the stacked gate layers. A conductive layer is deposited in the contact hole and excess conductive material is removed.

10 Claims, 5 Drawing Sheets

PATTERNING FOR ELLIPTICAL $V_{SS}$ CONTACT ON FLASH MEMORY

TECHNICAL FIELD

The present invention relates generally to the field of integrated circuit manufacture and, more particularly, to a method of improving the depth of focus and overlay margin within the stacked gate layer of a flash memory device.

BACKGROUND

Flash memory is a type of electronic memory media which can be rewritten and hold its content without power. Unlike dynamic random access memory (DRAM) and static random access memory (SRAM) memory chips, in which a single byte can be erased, flash memory is typically erased and written in fixed multi-bit blocks or sectors. Evolving out of electrically erasable read only memory (EEPROM) chip technology, which can be erased in place, flash memory is less expensive and more dense. This new category of EEPROMs has emerged as an important non-volatile memory which combines the advantages of EPROM density with EEPROM electrical erasability.

Conventional flash memories are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer often is a multilayer insulator such as an oxide-nitride-oxide (ONO) layer having a nitride layer sandwiched between two oxide layers. Lastly, a polysilicon control gate overlies the interpoly dielectric layer.

Flash memory devices require a common source line, for example, to provide a connection to ground voltage (e.g., a $V_{ss}$ contact) during a read operation. Generally, the $V_{ss}$ contact is formed between stacked gate layers of the flash memory device. As is known in the art, contacts are among the most difficult features to pattern in semiconductor manufacturing. Not only are they smaller than any other circuit structure (except gates), but their images are intrinsically 3-dimensional, with the same contact having minimum feature size in both x and y direction and the laws of diffraction reducing the range of focus along the z-direction.

In a conventional method of forming the $V_{ss}$ contact in a flash memory device, a gate oxide layer, a floating gate polysilicon layer, an inter-gate insulating layer and a control gate polysilicon layer are sequentially formed on a semiconductor substrate. Through photolithographic processes, the stacked layers are patterned to form a stacked gate pattern, e.g., a series of stacked gate layers. Impurities are implanted into the substrate using the stacked gate pattern as an implanting mask to form source/drain regions outside of the stacked gate pattern, and an interlayer insulating layer is deposited on the resulting structure. Using a photoetching process, the interlayer insulating layer is patterned between stacked gate layers to form a circular contact hole, exposing a predetermined region of the semiconductor substrate. A conductive layer is then deposited in the contact hole and on the interlayer insulating layer. A planarization process such as an etch-back or a chemical mechanical polish is carried out to leave the conductive layer in the contact hole and remove the portion of the conductive layer that is outside of the contact hole, thereby forming the $V_{ss}$ contact.

Figure 1:
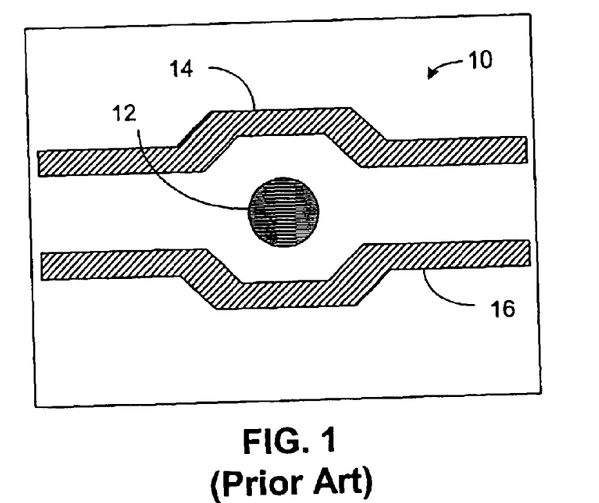
FIG. 1 is a schematic top view of a prior art $V_{ss}$ contact formed between stacked gate layers of a flash memory device.

Referring to FIG. 1, a stacked gate pattern 10 of a prior art flash memory device is illustrated. A $V_{ss}$ contact 12 is patterned between a first stacked gate layer 14 and a second stacked gate layer 16. As stated previously, the $V_{ss}$ contact 12 typically is circular in shape.

A pervasive trend in modern integrated circuit manufacture is to produce semiconductor devices, such as flash memory devices, that are as small as possible. The reduction in size of flash memory devices requires high resolution technology and a sufficient depth of focus (DOF), particularly in the formation of contact holes. DOF is the range of lens-wafer distances over which line widths are maintained within specifications and resist profiles are adequate. As flash memory devices are reduced in size, each stacked gate layer 14, 16 of the stacked gate pattern 10 is formed closer to adjacent stacked gate layers, thus requiring a smaller $V_{ss}$ contact 12. As the $V_{ss}$ contact 12 is reduced in size, DOF margin becomes an issue in patterning the $V_{ss}$ contact. In present integrated circuit fabrication, DOF is becoming so small that it is a concern as to whether optical wafer steppers are capable of maintaining the image in focus. This problem is evident in forming components having small feature size, such as contact holes.

Another concern in integrated circuit manufacture is the lateral positioning between layers comprising the integrated circuit, which is known as overlay. As feature sizes shrink, the overlay tolerances must become smaller in order to minimize the creation of defective devices. The reduction in size of the flash memory device requires the $V_{ss}$ contact 12 and adjacent stacked gate layers 14, 16 to be in closer proximity to one another, thus creating overlay margin issues.

As a result, there exists a need in the art for a method of patterning a $V_{ss}$ contact in a flash memory device that improves the DOF margin and the overlay margin within the stacked gate layer.

SUMMARY OF THE INVENTION

According to one aspect of the invention, the invention is directed to a method of processing an integrated circuit wafer to form a contact in a flash memory device. The method can include forming a plurality of stacked gate layers on a semiconductor substrate, wherein each stacked gate layer extends in a predefined direction and is substantially parallel to other stacked gate layers; depositing an interlayer insulating layer over the plurality of stacked gate layers; patterning a contact hole between a first stacked gate layer of the plurality of stacked gate layers and a second stacked gate layer of the plurality of stacked gate layers, wherein the contact hole is an elongated shape; and depositing a conductive layer in the contact hole.

Another aspect of the invention relates to flash memory device, including a plurality of stacked gate layers, wherein each stacked gate layer extends in a predefined direction and is substantially parallel to other stacked gate layers; and a contact formed between a first stacked gate layer of the plurality of stacked gate layers and a second stacked gate layer of the plurality of stacked gate layers, wherein the contact is formed in an elongated shape.

Other aspects, features, and advantages of the invention will become apparent from the following detailed description. It should be understood, however, that the detailed description and specific examples, while indicating several embodiments of the present invention, are given by way of illustration only and various modifications may naturally be performed without deviating from the present invention.

DISCLOSURE OF INVENTION

In the detailed description that follows, corresponding components have been given the same reference numerals, regardless of whether they are shown in different embodiments of the present invention or at difference times during a wafer processing method. To illustrate the present invention in a clear and concise manner, the drawings may not necessarily be to scale.

Figure 2:
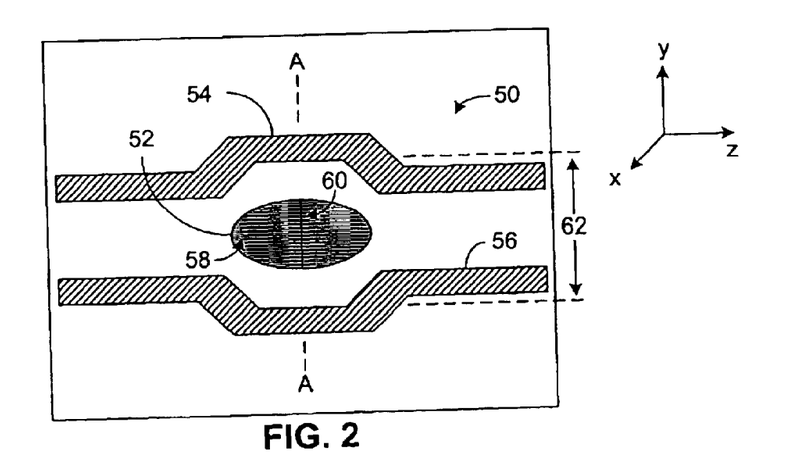
FIG. 2 is a schematic top view of a $V_{ss}$ contact formed between stacked gate layers of a flash memory device in accordance with an embodiment of the present invention.

Referring to FIG. 2, a stacked gate pattern 50 of a flash memory device in accordance with an embodiment of the invention is illustrated. The stacked gate pattern 50 includes a plurality of stacked gate layers 54, 56. As can bee seen in FIG. 2, the stacked gates layers 54, 56 of the stacked gate pattern 50 form a series of rows, and the rows are substantially parallel to each other.

To assist in describing the invention, the stacked gates layers 54, 56 can be described with respect to a 3 dimensional Cartesian coordinate system. With respect to FIG. 2, for example, the z-axis is represented as the horizontal component (e.g., left to right), the y-axis is represented as the vertical component (e.g., bottom to top), and the x-axis is represented as the depth component (e.g., coming out of the page). Thus, the "rows" of stacked gate layers lie in the z-axis, e.g., they form a line that extends along the z-axis, while the width and height components of each stacked gate layer lie in the y-axis and the x-axis respectively.

A $V_{ss}$ contact 52 is formed between the first stacked gate layer 54 and the second stacked gate layer 56. The $V_{ss}$ contact is formed in an elongated shape, such as an ellipse, for example, wherein a major axis 58 of the ellipse (i.e., the axis that passes through the foci of the ellipse) is substantially parallel to the stacked gate layers 54, 56, and the minor axis 60 of the ellipse (i.e. the axis perpendicular to the major axis at the midpoint between the foci) is substantially perpendicular to the stacked gate layers 54, 56.

Since the major axis 58 of the ellipse is substantially parallel to the rows of stacked gate layers 54, 56 and the rows of stacked gate layers lie in the z-axis, it follows that the major axis 58 of the ellipse also lies in the z-axis. In light of the above and with reference to FIG. 2, it follows that the minor axis 60 of the ellipse lies in the y-axis. As will be explained in more detail below, the elongated shape provides a contact pattern that minimizes DOF and overlay issues during the fabrication of a flash memory device.

Eccentricity is a numerical value that determines the shape of an ellipse and is defined as the ratio of the distance between the foci to the length of the major axis. Eccentricity is always less than 1, and is expressed by the equation $$\frac{\sqrt{(a^2 - b^2)}}{a} \qquad \text{Eq. 1}$$

where "a" is one half the length of the ellipse's major axis, and "b" is one half the length of the ellipse's minor axis. A perfectly circular ellipse has an eccentricity of 0, while an extremely long and narrow ellipse has an eccentricity that approaches 1. Thus, an elliptical contact having an eccentricity greater than zero, by definition, is not a perfect circle. Such an elliptical contact has a long or wide portion (the major axis) and a narrow or thin portion (the minor axis).

As packing densities of flash memory devices increase, the separation 62 between stacked gate layers is reduced. By forming an elliptical $V_{ss}$ contact between stacked gate layers with its minor axis 60 substantially perpendicular to the stacked gate layers 54, 56, the length "b" of the minor axis 60 is constrained by one half of the separation 62 between stacked gate layers, plus any required overlay margin. This same constraint is imposed on prior art circular $V_{ss}$ contacts, wherein a radius "r", of the circular contact must fit within the same limitations.

Thus, as the distance of separation 62 between stacked gate layers 54, 56 is reduced, the radius "r" of the circular $V_{ss}$ contact and the minor axis "b" of the elliptical $V_{ss}$ contact also must be reduced. A reduction in the radius of the circular $V_{ss}$ contact has the effect of reducing the size of the circular $V_{ss}$ contact in all directions since, by definition, a circle is composed of all points having a distance "r" from a center point. As the radius is reduced, the entire circle is reduced.

The elliptical $V_{ss}$ contact 52, on the other hand, only is reduced along the minor axis 60. The major axis 58 is not affected by the reduction in separation between stacked gate layers 54, 56. Therefore, the elliptical $V_{ss}$ contact 52 formed between stacked gate layers 54, 56 can occupy a larger area than a circular $V_{ss}$ contact formed between the same stacked gate layers. Moreover, the elliptical $V_{ss}$ contact can be dimensioned along its major axis 58 so as to maintain feature size above a threshold value, and thus minimize DOF issues. For example, the length of the major axis 58 can be increased as the length of the minor axis 60 is decreased, thereby maintaining the contact area above a threshold value.

Furthermore, since the elliptical $V_{ss}$ contact 52 can overcome DOF issues by maintaining feature size above a threshold value (e.g., by increasing the major axis 58), the minor axis 60 can be reduced to a greater extent than can the radius "r" of a circular contact. This provides an increase in overlay margin between the $V_{ss}$ contact 52 and the stacked gate layers 54, 56 when compared to a circular $V_{ss}$ contact. In one embodiment, the ratio of the minor axis length "b" relative to the major axis length "a" (e.g., a/b) is about 1.1 to 1.4, or in other words, the length of the minor axis is about 71 percent to about 90 percent of the length of the major axis.

Figure 3:
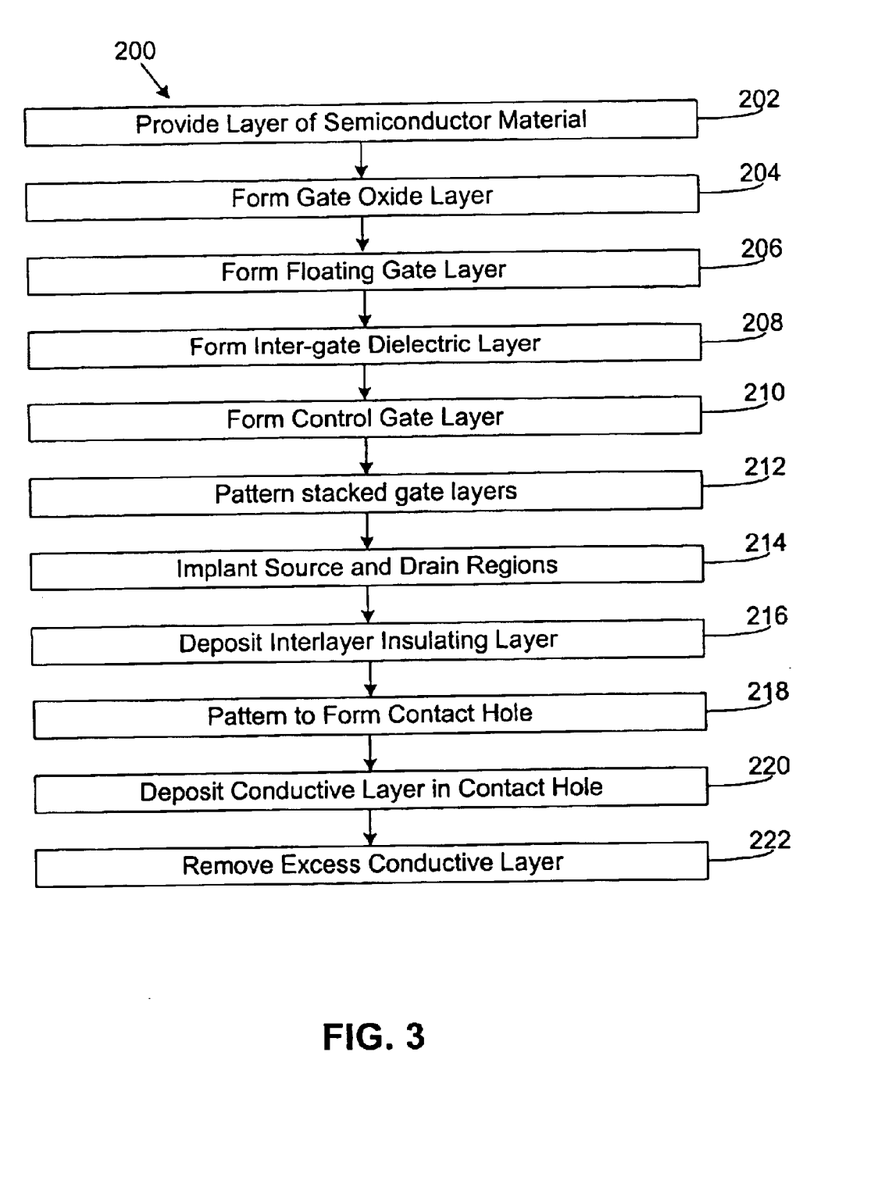
FIG. 3 is a flow diagram illustrating an exemplary embodiment of a method of processing a wafer in accordance with the present invention.

Referring to the flowchart 200 of FIG. 3 in conjunction with the diagrams of FIG. 4A–FIG. 4H, exemplary processing steps for fabricating the $V_{ss}$ contact 52 between stacked gate layers 54, 56 of a flash memory device are shown.

Figure 4A:
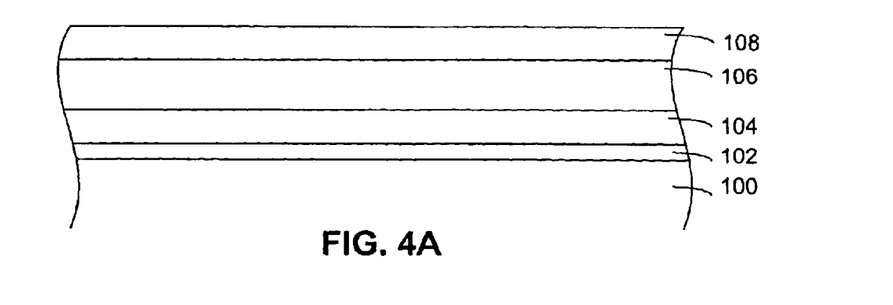
FIG. 4A is a sectional view of a semiconductor wafer at a certain point during processing of the wafer using the method in accordance with an embodiment of the present invention.

The process begins with a layer of semiconductor material 100 as shown in step 202. In step 204, a gate oxide layer 102 is deposited or grown on a semiconductor substrate 100. Deposition or growth may be performed through various well known processes, such as chemical vapor deposition (CVD) or dry oxidation in an oxygen and nitrogen ambient atmosphere, for example. Following the formation of the gate oxide layer 102, a floating gate layer 104 is deposited over the gate oxide layer in step 206, and in step 208 an inter-gate dielectric layer 106 is deposited over the floating gate layer 104. The inter-gate dielectric layer 106 typically is an oxide-nitride-oxide (ONO) composition and is formed using conventional techniques. For example, the ONO layer can be formed in a three-stage process, which includes forming a first film of silicon dioxide, depositing a film of silicon nitride on the silicon dioxide, and then depositing a second film of silicon dioxide on the silicon nitride film.

Figure 4B:
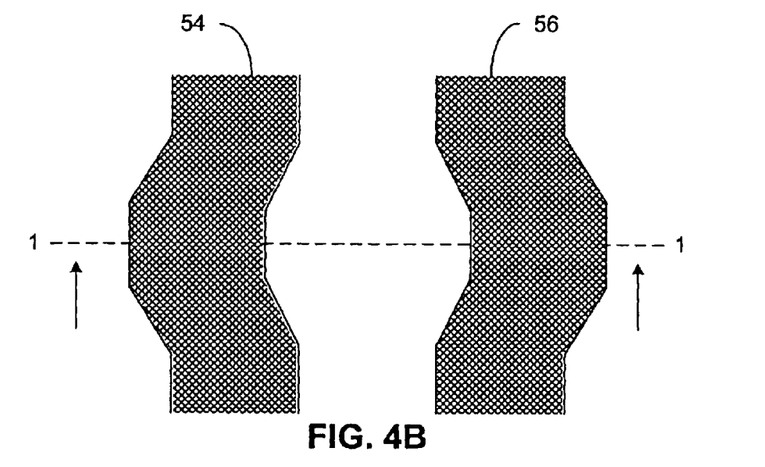
FIG. 4B is a top view of the semiconductor wafer of FIG. 4A during another point of the wafer processing.
Figure 4C:
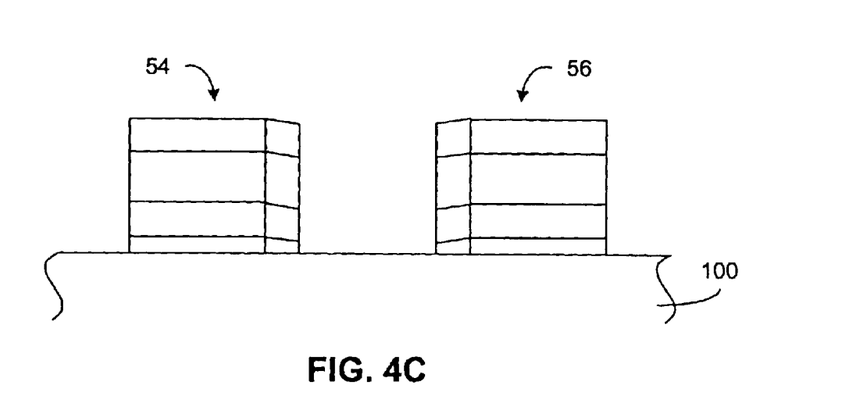
FIG. 4C is a cross-section taken along the line 1—1 of FIG. 4B.

At step 210, a control gate layer 108 is formed over the intergate dielectric layer 106. Formation of the control gate layer 108 includes, for example, depositing a layer of polysilicon material on the surface of the inter-gate dielectric layer 106 using low pressure chemical vapor deposition as is known by those skilled in the art. Using conventional photolithographic processes, the stacked gate layer is patterned at step 212 to form a stacked gate pattern, e.g., stacked gate layers 54, 56, as shown in FIG. 4B and FIG. 4C.

Figure 4D:
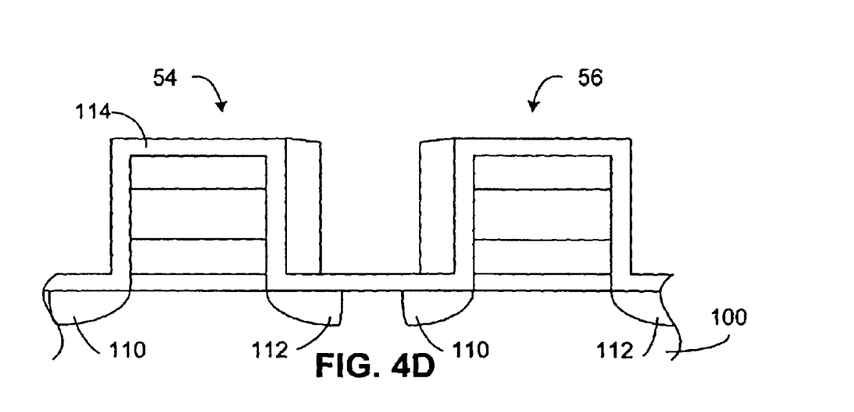
FIG. 4D is a sectional view of the semiconductor wafer during another point of the wafer processing.

Next at step 214, impurities are implanted into the substrate 100 using the stacked gate pattern as an implanting mask to form source 110 and drain 112 regions outside the stacked gate pattern, as is conventional. At step 216, an interlayer insulating layer 114 is deposited on the resulting structure, as shown in FIG. 4D. The interlayer insulating layer 114, for example, can be formed by depositing a silicon oxide film on the stacked gate pattern by means of sputtering or CVD and subsequently polishing the silicon oxide film by chemical mechanical polish (CMP). Alternatively, the interlayer insulating layer 114 may be a multilayer film such as a silicon nitride film, an SOG (spin on glass) film or a BPSG (boron phosphor silicate lass) film.

Figure 4E:
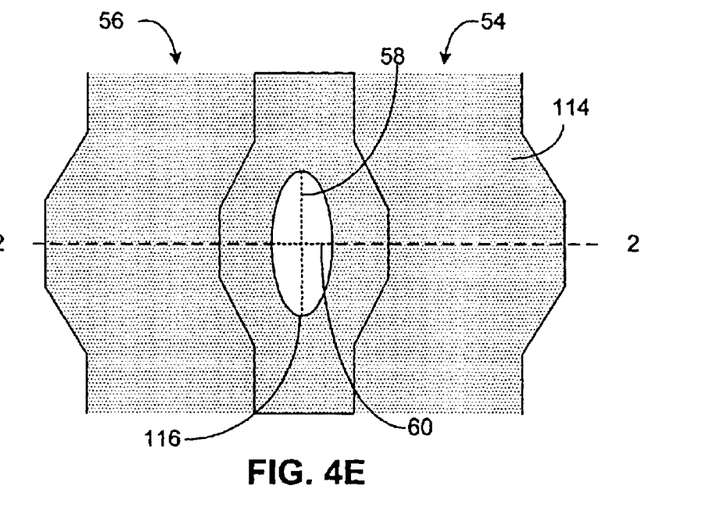
FIG. 4E is a top view of the semiconductor wafer of FIG. 4A during yet another point of the wafer processing.
Figure 4F:
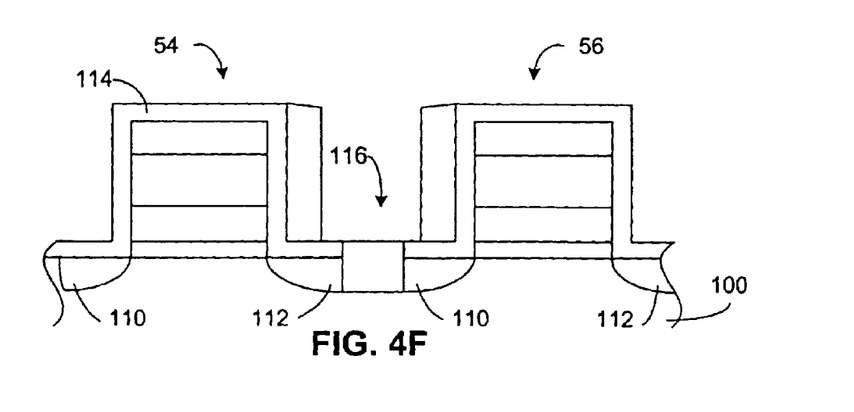
FIG. 4F is a cross-section taken along the line 2—2 of FIG. 4E.

Moving to step 218, a $V_{ss}$ contact hole 116 is patterned in the interlayer insulating layer 114 between stacked gate layers 54, 56 using conventional photolithographic techniques, as shown in FIG. 4E and FIG. 4F. As disclosed previously, the $V_{ss}$ contact hole 116 is patterned in an elliptical shape, wherein the minor axis 60 of the ellipse is substantially perpendicular to the stacked gate layers 54, 56 and the major axis 58 of the ellipse is substantially parallel to the stacked gate layers 54, 56.

Figure 4G:
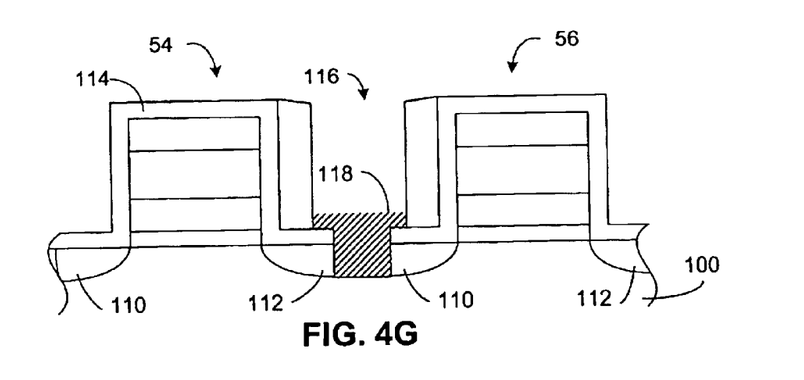
FIG. 4G is a sectional view of the semiconductor wafer during yet another point of the wafer processing.
Figure 4H:
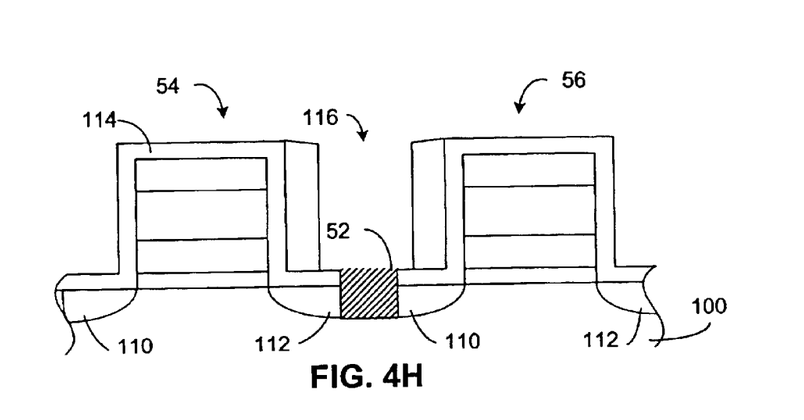
FIG. 4H is a sectional view of the semiconductor wafer during yet another point of the wafer processing.

At step 220, the contact hole 116 is filled with a suitable conductive material (e.g., a metal, a metal containing compound or a semiconductor). For example, a conductive layer 118 such as a doped polysilicon layer or a metal polycide layer is deposited in the contact hole 116 and on the interlayer insulating layer 114 as shown in FIG. 4G. Moving to step 222, a planarization process such as an etch-back or a chemical mechanical polish is carried out to leave the conductive layer in the contact hole and remove the portion of the conductive layer that is outside of the contact hole, thereby forming the $V_{ss}$ contact 52 as shown in FIG. 4H.

As one skilled in the art will appreciate, the exemplary method described herein can be modified. For example, certain steps can be omitted, certain steps can be carried out concurrently, and other steps can be added.

Figure 5:
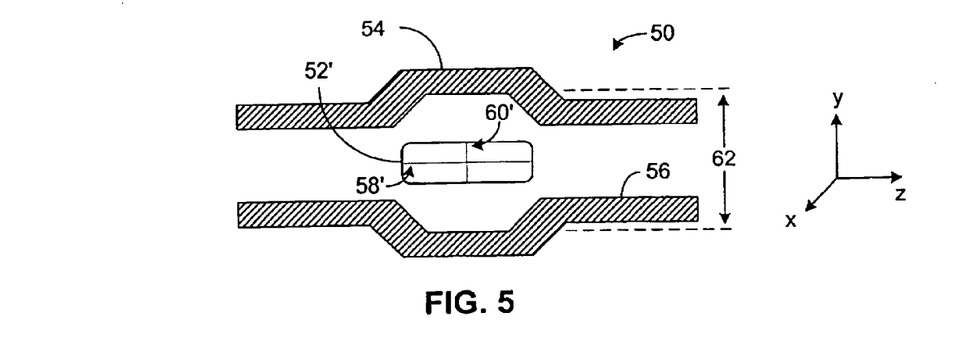
FIG. 5 is a schematic top view of a $V_{ss}$ contact formed between stacked gate layers of a flash memory device in accordance with another embodiment of the present invention.

Referring now to FIG. 5, a stacked gate pattern 50' of a flash memory device in accordance with another embodiment of the invention is illustrated. The stacked gate pattern 50' includes a plurality of stacked gate layers 54, 56. A $V_{ss}$ contact 52' is formed between the first stacked gate layer 54 and the second stacked gate layer 56. The $V_{ss}$ contact is formed in the shape of a rectangle, wherein a first pair of sides 300 are longer than a second pair of sides 302. The first pair of sides 300 lie in the z-axis and are substantially parallel to the stacked gate layers 54, 56. The second pair of sides 302 lie in the y-axis and are substantially perpendicular to the stacked gate layers 54, 56. With respect to the rectangular $V_{ss}$ contact 52', a major axis 58' is defined as an axis parallel to the first pair of sides 300 and intersecting a midpoint of the second pair of sides 302, and a minor axis 60' is defined as an axis parallel to the second pair of sides 302 and intersecting a midpoint of the first pair of sides 300.

As was described previously with respect to the elliptical $V_{ss}$ contact 52, the rectangular $V_{ss}$ contact 52' formed between stacked gate layers 54, 56 can occupy a larger area than a circular $V_{ss}$ contact formed between the same stacked gate layers. Additionally, the rectangular $V_{ss}$ contact 52' can be dimensioned along the z-axis so as to maintain feature size above a threshold value, and thus minimize DOF issues. For example, the length of the first pair of sides 300 can be increased as the length of the second pair of sides 302 are decreased, thereby maintaining the contact area above a threshold value.

Furthermore, since the first pair of sides 300 of the rectangular $V_{ss}$ contact 52' can be increased to maintain feature size above a threshold value, the length of the second pair of sides 302 can be reduced to a greater extent than can the radius "r" of a circular contact. This provides an increase in overlay-Margin between the $V_{ss}$ contact 62' and the stacked gate layers 54, 56 when compared to a circular $V^{ss}$ contact. In one embodiment, the ratio of the second pair of sides 302 relative to the first pair of sides 300 (first pair/second pair) is about 1.1 to 1.4, or in other words, the length of the second pair of sides 302 are about 71 percent to about 90 percent of the length of the first pair of sides 300.

Although particular embodiments of the invention have been described in detail, it is understood that the invention is not limited correspondingly in scope, but includes all changes, modifications and equivalents coming within the spirit and terms of the claims appended hereto. For example, while the exemplary embodiment has been illustrated using a floating gate memory cell, it will be appreciated by those skilled in the art that the invention also may be applied to a flash memory device employing a silicon-oxide-nitride-oxide-silicon (SONOS) memory cell.

What is claimed is:

1. A method of forming a contact in a flash memory device that improves the depth of focus (DOF) margin and the overlay margin between a plurality of stacked gate layers and the respective contact, comprising the steps of:

forming a plurality of stacked gate layers on a semiconductor substrate, wherein each stacked gate layer extends in a predefined direction and is substantially parallel to other stacked gate layers;

depositing an interlayer insulating layer over the plurality of stacked gate layers;

patterning a contact hole between a first stacked gate layer of the plurality of stacked gate layers and a second stacked gate layer of the plurality of stacked gate layers, wherein the contact hole is an elliptical shape having a major axis and a minor axis, and the contact hole is dimensioned along the major axis so as to maintain focus of an image of the contact hole as the minor axis is reduced in size towards a DOF limit; and depositing a conductive layer in the contact hole.

2. The method of claim 1, wherein the step of patterning a contact hole between a first stacked gate layer and a second stacked gate layer includes aligning the major axis of the contact hole substantially parallel to the predefined direction of the stacked gate layers.

3. The method of claim 1, wherein the step of patterning a contact hole between a first stacked gate layer and a second stacked gate layer includes aligning the minor axis of the contact hole substantially perpendicular to the predefined direction of the stacked gate layers.

4. The method of claim 1, further comprising the step of:

removing a portion of the conductive layer that is outside the contact hole to leave the conductive layer in the contact hole.

5. The method of claim 1, wherein the step of patterning a contact hole between a first stacked gate layer and a second stacked gate layer includes forming the minor axis of the contact hole to be about 71 percent to about 90 percent of a major axis of the contact hole.

6. A flash memory device, comprising:

a plurality of stacked gate layers, wherein each stacked gate layer extends in a predefined direction and is substantially parallel to other stacked gate layers; and a contact formed between a first stacked gate layer of the plurality of stacked gate layers and a second stacked gate layer of the plurality of stacked gate layers, wherein the contact is formed in an elliptical shape.

7. The flash memory device of claim 6, wherein the contact includes a major axis, and the major axis is substantially parallel to the predefined direction of the stacked gate layers.

8. The flash memory device of claim 6, wherein the contact includes a minor axis, and the minor axis is substantially perpendicular to the predefined direction of the stacked gate layers.

9. The flash memory device of claim 6, wherein the contact is a $V_{ss}$ contact.

10. The flash memory device claim 6, wherein a minor axis of the contact is about 71 percent to about 90 percent of a major axis of the contact.

* * * * *

UNITED STATES PATENT AND TRADEMARK OFFICE
CERTIFICATE OF CORRECTION

PATENT NO. : 6,900,124 B1
DATED : May 31, 2005
INVENTOR(S) : Kim et al.

It is certified that error appears in the above-identified patent and that said Letters Patent is hereby corrected as shown below:

Column 6,
Line 46, replace "contact 62'" with -- contact 52' --

Signed and Sealed this

Ninth Day of August, 2005

JON W. DUDAS
*Director of the United States Patent and Trademark Office*